US008834230B2

(12) United States Patent
Furukawa et al.

(10) Patent No.: US 8,834,230 B2
(45) Date of Patent: Sep. 16, 2014

(54) WAFER POLISHING METHOD AND DOUBLE-SIDE POLISHING APPARATUS

(75) Inventors: Daisuke Furukawa, Chikuma (JP); Kazumasa Asai, Chikuma (JP); Takahiro Kida, Chikuma (JP); Tadao Tanaka, Chikuma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 804 days.

(21) Appl. No.: 13/002,449

(22) PCT Filed: Jun. 30, 2009

(86) PCT No.: PCT/JP2009/003021
§ 371 (c)(1),
(2), (4) Date: Jan. 3, 2011

(87) PCT Pub. No.: WO2010/013390
PCT Pub. Date: Feb. 4, 2010

(65) Prior Publication Data
US 2011/0130073 A1   Jun. 2, 2011

(30) Foreign Application Priority Data

Jul. 31, 2008 (JP) ................................ 2008-197478
Jul. 31, 2008 (JP) ................................ 2008-197508
Jul. 31, 2008 (JP) ................................ 2008-197741

(51) Int. Cl.
*B24B 49/00* (2012.01)
*B24B 51/00* (2006.01)
*H01L 21/02* (2006.01)
*B24B 37/08* (2012.01)
*B24D 7/12* (2006.01)
*H01L 21/66* (2006.01)
*B24B 37/04* (2012.01)
*B24B 49/12* (2006.01)

(52) U.S. Cl.
CPC ........ *B24B 37/042* (2013.01); *H01L 21/02024* (2013.01); *B24B 37/08* (2013.01); *B24D 7/12* (2013.01); *H01L 22/26* (2013.01); *H01L 22/12* (2013.01); *B24B 49/12* (2013.01)

USPC .......... 451/6; 451/8; 451/36; 451/37; 451/41; 451/57; 451/59; 451/60; 451/63

(58) Field of Classification Search
USPC ........ 340/680; 451/5, 6, 8, 11, 36, 37, 41, 57, 451/58, 59, 60, 63, 261–269
See application file for complete search history.

(56) References Cited

U.S. PATENT DOCUMENTS 5,619,329 A   4/1997   Otani
5,938,502 A   8/1999   Kubo
(Continued)

FOREIGN PATENT DOCUMENTS

CN   1279506 A   1/2001
CN   1322374 A   11/2001
(Continued)

OTHER PUBLICATIONS

Office Action issued in Japanese Application No. 2008-197508 dated Jul. 12, 2011 (w/ Partial English Translation).
(Continued)

*Primary Examiner* — Timothy V Eley
(74) *Attorney, Agent, or Firm* — Oliff PLC

(57) ABSTRACT

The present invention is a wafer polishing method including simultaneously polishing both surfaces of a wafer by pressing and rubbing the wafer, while holding the wafer with: a lower turn table having a flat polishing-upper-surface rotationally driven; an upper turn table having a flat polishing-lower-surface rotationally driven, the upper turn table being arranged with facing to the lower turn table; and a carrier having a wafer-holding hole for holding the wafer, wherein the polishing is performed while measuring a thickness of the wafer through a plurality of openings provided between a rotation center and an edge of the upper turn table or the lower turn table, and switching a polishing slurry with a polishing slurry having a different polishing rate during the polishing of the wafer. As a result, there is provided a wafer polishing method that can manufacture a wafer having a high flatness and a high smoothness at high productivity and high yield.

16 Claims, 12 Drawing Sheets

(56) References Cited

U.S. PATENT DOCUMENTS

| | | | |
|---|---|---|---|
| 6,066,266 A * | 5/2000 | Osugi et al. | 216/85 |
| 6,301,009 B1 | 10/2001 | Tinker | |
| 6,746,319 B2 | 6/2004 | Tada et al. | |
| 7,016,795 B2 * | 3/2006 | Swedek et al. | 702/64 |
| 7,137,867 B2 * | 11/2006 | Nagayama et al. | 451/5 |
| 7,147,541 B2 * | 12/2006 | Nagayama et al. | 451/5 |
| 7,508,201 B2 * | 3/2009 | Tada et al. | 324/230 |
| 7,614,934 B2 * | 11/2009 | Onishi et al. | 451/6 |
| 2001/0024937 A1 | 9/2001 | Inaba | |
| 2002/0042243 A1 | 4/2002 | Ihsikawa et al. | |
| 2002/0195424 A1 | 12/2002 | Tanaka | |
| 2005/0026425 A1 * | 2/2005 | Hakata | 438/645 |
| 2005/0124264 A1 | 6/2005 | Tominaga et al. | |
| 2006/0009132 A1 * | 1/2006 | Bennett et al. | 451/8 |
| 2006/0037699 A1 | 2/2006 | Nakamori et al. | |
| 2006/0194511 A1 | 8/2006 | Nagayama et al. | |
| 2006/0219678 A1 | 10/2006 | Sopori | |
| 2006/0274326 A1 | 12/2006 | Kobayashi et al. | |

FOREIGN PATENT DOCUMENTS

| | | |
|---|---|---|
| CN | 1643658 A | 7/2005 |
| CN | 1717785 A | 1/2006 |
| CN | 101128920 A | 2/2008 |
| EP | 1 852 900 A1 | 11/2007 |
| JP | A-07-004921 | 1/1995 |
| JP | A-07-306018 | 11/1995 |
| JP | A-2007-306018 | 11/1995 |
| JP | A-09-038849 | 2/1997 |
| JP | A-11-135617 | 5/1999 |
| JP | A-11-262858 | 9/1999 |
| JP | A-2000-012540 | 1/2000 |
| JP | A-2001-009699 | 1/2001 |
| JP | A-2001-077068 | 3/2001 |
| JP | A-2001-198802 | 7/2001 |
| JP | A-2001-287158 | 10/2001 |
| JP | A-2002-059364 | 2/2002 |
| JP | A-2002-100594 | 4/2002 |
| JP | A-2002-221406 | 8/2002 |
| JP | B2-3327817 | 9/2002 |
| JP | A-2003-001559 | 1/2003 |
| JP | A-2003-057027 | 2/2003 |
| JP | A-2003-133270 | 5/2003 |
| JP | A-2003-254741 | 9/2003 |
| JP | A-2004-343090 | 12/2004 |
| JP | A-2004-363451 | 12/2004 |
| JP | A-2005-081518 | 3/2005 |
| JP | A-2006-095677 | 4/2006 |
| JP | A-2006-176341 | 7/2006 |
| JP | A-2006-224233 | 8/2006 |
| JP | A-2006-231471 | 9/2006 |
| JP | A-2006-324417 | 11/2006 |
| JP | A-2007-044814 | 2/2007 |
| JP | A-2007-290050 | 11/2007 |

OTHER PUBLICATIONS

Office Action issued in Japanese Application No. 2008-197741 dated Jul. 12, 2011 (w/ Partial English Translation).
Japanese Office Action in Japanese Patent Application No. 2008-197508; dated Nov. 8, 2011 (with partial English-language translation).
Chinese Office Action issued in Chinese Patent Aplication No. 200980127186.4 dated Apr. 23, 2013 (w/ partial translation).
Dec. 6, 2011 Decision to Dismiss issued in Japanese Patent Application No. 2008-197741 (with partial translation).
Chinese Search Report issued in Chinese Application No. 200980127186.4 dated Sep. 3, 2012 (w/translation).
Chinese Office Action issued in Chinese Application No. 200980127186.4 dated Sep. 7, 2012 (w/translation).
International Preliminary Report on Patentability in International Application No. PCT/JP2009/003021; dated Mar. 8, 2011.
Japanese Office Action in Japanese Patent Application No. 2008-197508; dated Mar. 1, 2011 (with partial English-language translation).
Japanese Office Action in Japanese Patent Application No. 2008-197741; dated Mar. 1, 2011 (with partial English-language translation).
Japanese Office Action in Japanese Patent Application No. 2008-197741; dated Nov. 24, 2010 (w/ partial English-language translation).
Japanese Office Action in Japanese Patent Application No. 2008-197478; dated Oct. 5, 2010 (w/ partial English-language translation).
Japanese Office Action in Japanese Patent Application No. 2008-197508; dated Nov. 24, 2010 (w/ partial English-language translation).
International Search Report in International Application No. PCT/JP2009/003021; dated Sep. 1, 2009 (w/ English-language translation).
Oct. 22, 2013 Office Action issued in Chinese Patent Application No. 200980127186.4 (with partial English Translation).
Apr. 7, 2014 Office Action issued in Taiwanese Patent Application No. 98122953 (with partial English Translation).

\* cited by examiner (b)

(a)

WAFER POLISHING METHOD AND DOUBLE-SIDE POLISHING APPARATUS

TECHNICAL FIELD

The present invention relates to a wafer polishing method and a double-side polishing apparatus, and specifically to a wafer polishing method and a double-side polishing apparatus that can efficiently manufacture a wafer for a semiconductor having a high flatness.

BACKGROUND ART

A conventional wafer manufacturing method will be explained by an example of a silicon wafer manufacturing method. First, a silicon single crystal ingot is grown, for example, by the Czochralski method (the CZ method). The obtained silicon single crystal ingot is sliced to produce silicon wafers, and thereafter the silicon wafers are subjected to each of the steps of chamfering, lapping, and etching one after the other. At least a polishing process is subsequently performed to make a main surface of each wafer a mirror surface.

In this polishing process of the wafer, for example, a double-side polishing apparatus may be used to polish both surfaces of the silicon wafer.

As the double-side polishing apparatus, a so-called four-way double-side polishing apparatus is normally used which has a planetary gear construction in which a carrier for holding wafers are arranged between a sun gear provided at a center portion and an internal gear provided at an outer circumferential portion.

The four-way double-side polishing apparatus can simultaneously polish both surfaces of the silicon wafers by inserting the silicon wafers into a plurality of carriers, in which wafer-holding holes are formed, to hold the wafers, by rotating an upper turn table and a lower turn table, in which a polishing pad is attached on each of the surfaces facing to the wafers, in a direction relative to one another with pressing the upper turn table and the lower turn table against front and back surfaces of each of the wafers, while supplying a polishing slurry from above the held silicon wafers, and by concurrently rotating and revolving the carrier with the sun gear and the internal gear.

However, when the above-described double-side polishing apparatus is used to polish, there are problems such that the productivity is low even though flat wafers can be obtained or on the contrary low flatness wafers are obtained even though the productivity is high.

This is because there is a tradeoff relationship between a polishing rate of the wafer and the flatness. To deal with these problems, quasi-static processing by keeping the polishing rate as low as possible is needed in a finishing stage.

In view of this, there has been used a polishing method to flatly and smoothly polish by switching a polishing agent into a polishing agent having a different grain diameter or a different pH on the identical turn table (See Patent Literature 1, for example), or by polishing while lowering a rotation number or decreasing a load when finishing is close at hand (See Patent Literature 2, for example).

Moreover, when the above-described double-side polishing apparatus is used to polish, the polishing rate of the wafer varies every polishing due to deterioration of a polishing jig material such as the polishing pad and the carrier. When the polishing is performed for a predetermined polishing time, there arises a problem such that thicknesses of the polished wafers are different respectively due to a different polishing rate.

In view of this, there is disclosed a double-side polishing apparatus that polishes while measuring the thickness of the wafer during polishing.

For example, with the polishing apparatus that polishes while measuring the thickness of a semiconductor wafer during polishing by using an optical reflection interferometry like inventions described in Patent Literature 3 and Patent Literature 4, the flatness of the polishing surface can be made high.

Moreover, according to the invention of Patent Literature 3 for example, with light having a light transmittable wavelength through the wafer, the thickness can be measured with forming focus by moving a measuring light flux along a thickness direction from a front surface of the semiconductor wafer to a back surface thereof.

However, in this art described in Patent Literature 3, since the focus is formed along the thickness, it is easy to be influenced by vibration of the wafer during the polishing, and a difference between a measured value and an actual thickness of the wafer therefore becomes large. It is also easy to be influenced by light attenuation depending on a distance from an object to be measured, and a distance between a point where the focus is formed and a point where the light is input and output needs to be approximated. There is therefore a problem of contamination and damage by mist due to the polishing slurry and the like in a passage of the light.

Moreover, a frequency of taking the measuring light from a designated area on a polishing surface in the measuring light needs to be increased during the polishing in order to improve the precision of the measurement. A confocal method such as Patent Literature 3 is, however, inferior in responsivity, and it has a fault such that the frequency of taking in is low.

CITATION LIST

Patent Literature 1: Japanese Unexamined Patent publication (Kokai) No. 2006-324417
Patent Literature 2: Japanese Unexamined Patent publication (Kokai) No. H9-38849
Patent Literature 3: Japanese Unexamined Patent publication (Kokai) No. 2002-59364
Patent Literature 4: Japanese Unexamined Patent publication (Kokai) No. H7-4921
Patent Literature 5: Japanese Patent No. 3327817

DISCLOSURE OF INVENTION

In the method described in Patent Literature 1 and Patent Literature 2 as above, polishing conditions (type of a polishing agent, a polishing load, and a speed against the polishing surface of each turn table to which the polishing pad is attached) are switched during one polishing cycle (one wafer in single wafer processing and a plurality of wafers in batch-wise manner processing).

In this method, however, the polishing conditions are not switched with taking account of deterioration of a polishing jig material such as the polishing pad and the carrier. A failure in a wafer shape, such as an outer peripheral sag, thereby occurs. This is because the deterioration to the above-mention material is generated by polishing, and the polishing conditions (for example, a polishing speed) thereby vary even in the case of polishing with the identical apparatus in the same conditions.

Moreover, since timing of switching the polishing conditions is constant regardless of the deterioration of the polishing jig material such as the polishing pad and the carrier, there arise problems such that the productivity becomes worse by increasing a polishing time with the deterioration of the polishing pad, and that excess or deficiency of polishing stock removal occurs.

The problem of the excess or deficiency of polishing stock removal may easily suppress by measuring the thickness to adjust during polishing or after and before polishing with extracting it. However, since the polishing needs to be stopped halfway and thereby the productivity becomes significantly worse, it is not realistic method.

Moreover, when the wafer is polished, the polishing rate varies due to the deterioration of the polishing pad and the like. As shown in FIG. 5, the polishing time required for polishing up to a target thickness of α accordingly greatly varies between the case of a high polishing rate and a low polishing rate. There thus arises a problem that the time required for polishing process is not stable to obtain a constant target thickness in the finish of polishing. When the polishing time is made constant, it is over-polished in case of a high polishing rate, a lot of failures such as scratch are thereby generated, and a yield greatly becomes worse. On the other hand, a polishing deficiency occurs in case of a low polishing rate, the flatness of the wafer thereby becomes worse, and the yield also becomes worse.

FIG. 6 shows the case where the thickness of the wafer in the finish of polishing can be made a constant target thickness α by measuring the thickness of the wafer during polishing.

In this way, the thickness in the finish can be made a target thickness by the measurement of the thickness of the wafer, but each polishing time greatly differs between the case of a high polishing rate and a low polishing rate. The time required for polishing processing is not therefore stable, also the quality of the wafer is not stable, and these become a bottleneck.

In a double-side polishing apparatus that performs polishing while measuring the thickness of the wafer during the polishing in real time by an optical reflection interferometry as described in Patent Literature 3 and 4, a hole for a passage of light is provided at a polishing turn table, and a material, which is light transmittable, does not give damage such as scratch to an object to be polished, and has resistance to a slurry such as a polishing agent, is attached as a window member to a polishing pad having a hole at the corresponding position to that of the hole for a passage of light. The window member is used as the polishing pad by unifying the window member with the polishing pad and by attaching them to the polishing turn table.

With the polishing apparatus as described above, the thickness of the wafer is consequently measured through the window member by the optical reflection interferometry during polishing, and the polishing is automatically stopped at the time of reaching to the target thickness.

For example, in the invention described in Patent Literature 4, the window is provided at a non-polishing side of the wafer, and light having a light transmittable wavelength through the wafer is used as the measuring light. In the invention described in Patent Literature 5, a window for measuring the thickness of the wafer is used, the window which uses a window member or a plug unified with a polishing pad on an upper surface of a lower turn table coming in contact with the polishing surface side of the wafer having a film.

However, in the inventions described in Patent Literatures 3 to 5 as described above, the window member unifies with the polishing pad, and therefore the polishing pad needs to be changed due to only damage of the window member. In addition, the window member more severely wastes in comparison with the polishing pad, and a lifetime of the window member thereby ends before the end of a lifetime of the polishing pad. Both of them are thus scraped, and resulting in making a lot of waste.

Moreover, as seen in the invention described in Patent Literature 5, the window locates at a polishing surface side of an object to be polished, that is, at an upper side of the turn table and a light passage system locates just below. A firm seal-material plug thereby needs to be used to enhance airtightness of the window member. It is therefore hard to change, it takes time for maintenance, and efficiency decreases.

The present invention was accomplished in view of the above-explained problems, and its object is to provide a wafer polishing method that can manufacture a wafer having a high flatness and a high smoothness at high productivity and high yield.

An another object of present invention is to provide a double-side polishing apparatus that can polish the wafer while measuring the thickness of the wafer with high precision without being influenced by a measurement error as represented by vibration of the wafer during polishing, in the double-side polishing apparatus that can polish while measuring the thickness of the wafer.

To achieve this object, the present invention provides a wafer polishing method including simultaneously polishing both surfaces of a wafer by pressing and rubbing the wafer, while holding the wafer with: a lower turn table having a flat polishing-upper-surface rotationally driven; an upper turn table having a flat polishing-lower-surface rotationally driven, the upper turn table being arranged with facing to the lower turn table; and a carrier having a wafer-holding hole for holding the wafer, wherein the polishing is performed while measuring a thickness of the wafer through a plurality of openings provided between a rotation center and an edge of the upper turn table or the lower turn table, and switching a polishing slurry with a polishing slurry having a different polishing rate during the polishing of the wafer.

In this manner, when the polishing is performed while measuring the thickness of the wafer at the time of simultaneously polishing both surfaces, the thickness of the wafer can be evaluated in real time. Timing of the switching with the slurry having a different polishing rate and the end of a polishing state can be therefore seen without stopping the polishing, and the time required for polishing processing can be reduced.

Moreover, for example, the wafer is first polished with a polishing slurry having a high polishing rate, and the polishing slurry is switched with a polishing slurry having a low polishing rate halfway. The polishing is thereby performed in a condition of a high rate and rough processing, and thereafter a high precision polishing is performed at a low rate. The time required for polishing the wafer can be thereby reduced, and the productivity can be increased without decreasing the flatness and smoothness of the wafer.

Consequently, the wafer can be polished at high productivity and high yield, and the wafer having a high flatness and a high smoothness can be manufactured.

Moreover, the plurality of openings are preferably provided at the upper turn table.

When the thickness of the wafer is measured during polishing through the plurality of openings provided at the upper turn table, a leak of the polishing slurry through the openings does not occur and the polishing slurry does not enter the inside of the openings. A measure against the leak is not therefore necessary. Consequently, the maintenance of the turn tables becomes easy, and a risk of a measuring problem of the thickness of the wafer can be suppressed.

Moreover, the wafer is preferably polished in a batch-wise manner.

Since the wafer polishing method according to the present invention enables the wafer having a high flatness to be obtained at high productivity, and the productivity can be more improved by polishing in a batch-wise manner. In the present invention, since the polishing is performed while measuring the thickness of the wafer through the plurality of openings, even in the case of simultaneously polishing a plurality of wafers in a batch-wise manner, the thicknesses of all wafers can be precisely measured.

Moreover, a method of measuring the thickness of the wafer is preferably an optical reflection interferometry by a wavelength-variable-infrared laser.

In this manner, when a reflection spectrum on the surface of the wafer (a situation of interference of light reflected from a front surface and a back surface of the wafer) is evaluated by the wavelength-variable-infrared laser, the thickness of the wafer can be measured with high precision during polishing.

Moreover, timing of the switching of the polishing slurry is preferably determined on the basis of at least one of an elapsed time from a start of the polishing, a polishing rate, polishing stock removal, and a lifetime of a polishing pad.

In this manner, when the switching of the polishing slurry is determined on the basis of the elapsed time from the start of the polishing, the polishing rate, the polishing stock removal, and the lifetime of a polishing pad, an appropriate response can be made according to circumstances against a polishing state of the wafer, which varies depending on the deterioration of the polishing jig material such as the polishing pad and the carrier. The target shape of the wafer, particularly improvement in the outer peripheral sag, stabilization of the flatness, and the target amount of the polishing stock removal can be therefore readily achieved.

Moreover, at least one of a polishing load, a rotation speed of the upper turn table, and a rotation speed of the lower turn table is preferably changed during the polishing of the wafer on the basis of measured data of the thickness of the wafer.

In this manner, when at least one of a polishing load, a rotation speed of the upper turn table, and a rotation speed of the lower turn table is changed, in addition to the switching with the slurry having a different polishing rate during the polishing of the wafer, a minute and appropriate response can be made during the polishing of the wafer against changes in the polishing conditions due to deterioration of a mechanism used for polishing. The wafer having a greatly high flatness of the polished surface can be therefore stably obtained.

Furthermore, the present invention provides a double-side polishing apparatus including at least: a lower turn table having a flat polishing-upper-surface rotationally driven; an upper turn table having a flat polishing-lower-surface rotationally driven, the upper turn table being arranged with facing to the lower turn table; and a carrier having a wafer-holding hole for holding a wafer, the apparatus comprising a plurality of openings provided between a rotation center and an edge of the upper turn table or the lower turn table, and a wafer-thickness-measuring mechanism for measuring a thickness of the wafer through the plurality of openings during polishing in real time, the apparatus wherein the wafer-thickness-measuring mechanism is fixed to a fixed end except the upper turn table and the lower turn table of the double-side polishing apparatus.

In this manner, when the plurality of openings for measuring the thickness of the wafer are provided at the upper turn table or the lower turn table in the double-side polishing apparatus that can simultaneously polish both surfaces of the wafer, a frequency of the measurement of the thickness can be increased, and the precision of the measurement can be thereby improved. In particular, in a batch-wise polishing apparatus that simultaneously polishes a plurality of wafers, the thicknesses of the wafers can be simultaneously measured through the plurality of openings, and it can particularly contribute to the improvement in the precision of the measurement.

In addition, when the wafer-thickness-measuring mechanism is fixed to a portion except the upper turn table and the lower turn table that are easily influenced by vibration during polishing, the thickness of the wafer can be measured without being influenced by the vibration and the like, and the precision of the measurement of the thickness can be improved.

Through the above-described effect, the thickness of the wafer can be accurately seen in real time during polishing, and the double-side polishing apparatus can therefore readily process the thickness of the polished wafer into a target thickness.

Moreover, a polishing pad and window members can be provided on a polishing surface of the lower turn table and the upper turn table, the polishing pad being provided with holes having a diameter larger than that of the openings at positions corresponding to the plurality of openings, the window members having a diameter larger than that of the openings and smaller than that of the holes of the polishing pad and having a thickness thinner than that of the polishing pad; and the window members can be separated from the polishing pad and are fixed to the upper turn table or the lower turn table through an adhesion layer.

In this manner, the polishing pad and the window members are adhered on the polishing surface of the upper turn table or the lower turn table on which the openings for measuring the thickness of the wafer are provided, the polishing pad being provided with holes having a diameter larger than that of the openings at positions corresponding to the plurality of openings, the window members having a diameter larger than that of the openings and smaller than that of the holes of the polishing pad and having a thickness thinner than that of the polishing pad.

This structure enables the window members and the polishing pad to be separated from one another, and they can be separately adhered. When one of the window members is damaged, the only window member is separated and changed so that it is not necessary that the polishing pad having an unexpired lifetime is scraped in vain. Since the only window member that severely waste are changed, cost for disposal of wastes can be reduced, and running cost can be reduced.

The separation of the widow member and the polishing pad makes the maintenance easy. Since the only window member can be changed, when the lifetime of the window member starts interrupting the measurement of the thickness of the wafer during polishing, the only window member can be changed with remaining the polishing pad. The double-side polishing apparatus can therefore polish the wafer while measuring the thickness with high precision and with reducing the wastes. In the present invention, since the plurality of openings are provided, a plurality of window members are accordingly necessary, and thereby the measurement of the thickness is accurately performed. As described above, it is necessary to set the lifetime respectively because of the separation of the window members and the polishing pad.

Moreover, the wafer-thickness-measuring mechanism preferably has an apparatus of a wavelength-variable-infrared laser having a light transmittable wavelength through the wafer.

In this manner, when the apparatus of a wavelength-variable-infrared laser having a light transmittable wavelength through the wafer is used as the wafer-thickness-measuring mechanism, the reflection spectrum on the surface of the wafer (a situation of interference of light reflected from a front surface and a back surface of the wafer) can be evaluated, and the thickness of the wafer can be thereby measured with high precision during polishing.

Moreover, the wavelength of the laser is preferably 1575 to 1775 nm.

In this manner, when the infrared laser having a wavelength of 1575 to 1775 nm and a high speed, for example, for communication application is used as a laser for the measurement, temporal resolution can be increased, and the thickness of the wafer can be evaluated with higher precision during polishing.

Moreover, the window members is preferably light transmittable by the laser radiated from the apparatus of a wavelength-variable-infrared laser.

In this manner, when the window members is light transmittable by the laser, absorption and reflection of the laser at the window members can be suppressed, and a decrease in strength of the measuring laser can be thereby suppressed. The precision of the measurement of the wafer can be consequently made higher.

Moreover, the wafer-thickness-measuring mechanism preferably measures a bulk thickness of the wafer.

In this manner, when the bulk thickness of the wafer is measured, an actual thickness of the wafer can be judged during polishing, and the thickness of the polished wafer can be thereby made closer to a target thickness.

Moreover, the plurality of openings are preferably provided with them equally spaced at a periphery of the upper turn table.

In this manner, when the plurality of openings are provided with them equally spaced, the thickness of the wafer can be readily measured, and the polishing can be thereby performed with high precision. In addition, when they are provided at the periphery, the thicknesses of all of the held wafers can be measured during polishing, for example, with the four-way double-side polishing apparatus without a bad influence on the polishing. When they are provided at the upper turn table, the leak of the polishing slurry through the openings can be suppressed, and the maintenance of the turn tables thereby becomes easy. In addition, a risk of a measuring problem of the thickness of the wafer can be suppressed.

Moreover, the fixed end to which the wafer-thickness-measuring mechanism is preferably fixed is a housing of the double-side polishing apparatus.

In this manner, when the wafer-thickness-measuring mechanism is fixed at the housing of the double-side polishing apparatus, the wafer-thickness-measuring mechanism can be protected from vibration and stain and also the thickness of the wafer can be measured with high precision through the plurality of openings. An influence of noise can be thereby reduced, and the thickness of the wafer can be measured with higher precision during polishing.

Moreover, the window members are preferably made of plastic.

In this manner, when the plastic, which is low-cost and has excellent steadiness, is used as the window members, a frequency of changing the window member can be reduced, and work and cost required for the change can be reduced.

Moreover, a relation of $t_1 \times \xi_1 \times P/100 > t_w + t_2$ and a relation of $t_w n_w > t_s n_s$ or $t_w n_w < t_s n_s$ are preferably satisfied, when a thickness of each of the window members is $t_w$ [µm], a refractive index of each of the window members is $n_w$, a thickness of the adhesion layer is $t_2$ [µm], a thickness of the wafer is $t_s$ [µm], a refractive index of the wafer is $n_s$, a thickness of the polishing pad is $t_1$ [µm], a compressibility of the polishing pad is $\xi_1$ [%/g/cm$^2$], a maximum polishing load is P [g/cm$^2$].

In this manner, when the relation of $t_1 \times \xi_1 \times P/100 > t_w + t_2$ is satisfied, protruding of the window members from the polishing pad can be suppressed during polishing, and deterioration of the flatness of the wafer at the window members can be suppressed.

In addition, when the relation of $t_w n_w > t_s n_s$ or $t_w n_w < t_s n_s$ is satisfied, it can be suppressed that the measurement becomes difficult by overlap between peaks of reflection light at the window members and reflection light at the wafer, for example, in the case of using laser for the measurement of the thickness of the wafer, and a decrease in the precision of the measurement can be suppressed.

The wafer having a high flatness can be consequently readily obtained while measuring the thickness of the wafer with high precision.

As explained above, the wafer polishing method according to the present invention enables the improvement in the deterioration of the shape of the wafer, such as the outer peripheral sag, due to small changes of the polishing conditions during polishing, the changes which are accompanied by the deterioration of the polishing jig material such as the polishing pad and the carrier, and the stabilization of the flatness of each wafer can be obtained.

In addition to these, since the polishing is performed while measuring the thickness of the wafer, the timing of the switching of the polishing agent can be changed on the basis of the deterioration of the polishing jig material such as the polishing pad and the carrier, and the target amount of the polishing stock removal can be obtained in relatively short time. The productivity can be therefore improved, the variation of the thickness can be made very small, and the yield can be greatly improved.

Moreover, the present invention provides the double-side polishing apparatus polishing while measuring the thickness of the wafer, the apparatus which can perform polishing while measuring the thickness of the wafer with high precision without being influenced by a measurement error as represented by the vibration of the wafer during polishing, does not have a particular waste, has a low running cost, can readily carry out the maintenance, and can polish while measuring the thickness of the wafer with high precision.

BEST MODE FOR CARRYING OUT THE INVENTION

Figure 7:
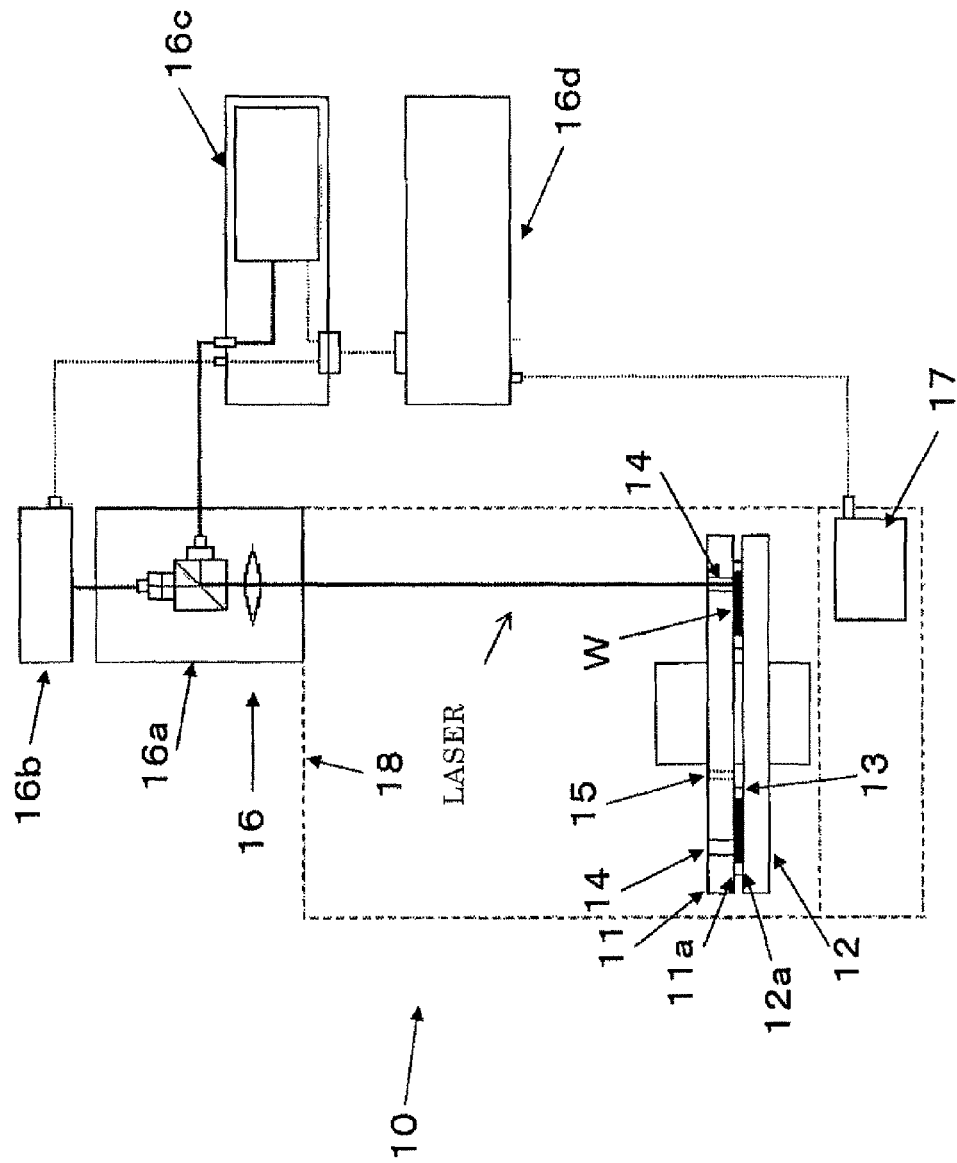
FIG. 7 is schematic view showing an example of the double-side polishing apparatus according to the present invention.

Hereinafter, the present invention will be explained in detail with reference to the drawings. However, the present invention is not restricted thereto. FIG. 7 is schematic view showing an example of the double-side polishing apparatus according to the present invention.

As shown in FIG. 7, the double-side polishing apparatus 10 according to the present invention includes the lower turn table 12 having the flat polishing-upper-surface 12a rotationally driven; the upper turn table 11 having the flat polishing-lower-surface 11a rotationally driven, the upper turn table being arranged with facing to the lower turn table 12; and the carrier 13 having the wafer-holding hole for holding the wafer W, in order to hold the wafer W, and also includes the wafer-thickness-measuring mechanism 16 for measuring the thickness of the wafer W during polishing.

The plurality of openings 14 for measuring the thickness of the wafer during polishing and a polishing-slurry-supply mechanism 15 are provided at a side of the upper turn table 11.

The wafer-thickness-measuring mechanism 16 may have, for example, at least an optical unit 16a for radiating laser to the wafer W, a photo detector 16b for detecting the laser reflected from the wafer W, a laser source unit 16c, and a calculation/control unit 16d for calculating the thickness of the wafer from the detected laser.

As described above, when the wafer-thickness-measuring mechanism is fixed to a portion (a fixed end) except the upper turn table and the lower turn table that are easily influenced by vibration during polishing, introducing unnecessary data, such as noise, into the measured raw data can be prevented. The precision of the measured data can be thereby remarkably improved in comparison with a conventional apparatus, and the thickness of the wafer can be thus accurately measured.

Moreover, when the plurality of openings for measuring the thickness of the wafer are provided at the upper turn table or the lower turn table, the frequency of the measurement of the thickness can be increased. In particular, this is preferable for the case of simultaneously polishing a plurality of wafers in a batch-wise manner, and the precision of the measurement can be thereby improved.

Through these effects, the thickness of the wafer can be precisely seen during polishing in comparison with a conventional apparatus, and the double-side polishing apparatus can therefore readily make the thickness of the polished wafer close to a target thickness.

Here, the fixed end to which the wafer-thickness-measuring mechanism 16 is fixed can be the housing 18 of the double-side polishing apparatus.

As described above, when the wafer-thickness-measuring mechanism is fixed to the housing of the double-side polishing apparatus, the wafer-thickness-measuring mechanism can be protected from vibration and stain. This allows the suppression of data deterioration and of introducing noise into the measured data of the thickness during polishing. The thickness of the wafer can be therefore measured with higher precision during polishing. It may be of course fixed to the fixed end of, for example, the ceiling of a house, but this has a disadvantage with regard to maintenance, vibration of the apparatus and the like.

Moreover, the wafer-thickness-measuring mechanism 16 can measure a bulk thickness of the wafer.

When the thickness of the wafer measured with the wafer-thickness-measuring mechanism is the bulk thickness, an actual thickness of the wafer during polishing is measured, and the thickness of the polished wafer can be therefore made closer to a target thickness. It can be of course the thickness of a SOI layer of a SOI wafer.

Moreover, the wafer-thickness-measuring mechanism 16 can have the apparatus of the wavelength-variable-infrared laser having a light transmittable wavelength through the wafer.

As described above, when the apparatus of a wavelength-variable-infrared laser having a light transmittable wavelength through the wafer is used as the wafer-thickness-measuring mechanism, a situation can be analyzed, in which front-surface reflecting light reflected from the front surface of the wafer and back-surface reflecting light reflected from the back surface of the wafer, out of the input laser to the wafer, are interfered. The thickness of the wafer can be thereby evaluated during polishing with precision of an order of magnitude of a few nanometers to some dozen micrometers.

In addition to this, when the apparatus of the wavelength-variable-infrared laser is used, a great difference of the thickness of the wafer to be polished can be managed by changing the wavelength of the laser to be input, and a light source itself does not need to be changed. The cost can be thus reduced.

The wavelength of the laser can be 1575 to 1775 nm.

As described above, when the laser having a wavelength of 1575 to 1775 nm is used, a decrease in the strength of the reflected laser, which is caused by the absorption of a part of the measuring laser into the wafer and the polishing slurry, can be suppressed, and the thickness of the wafer can be measured with high precision.

The plurality of openings 14 can be provided with them equally spaced at the periphery of the upper turn table 11.

As described above, when the plurality of openings are provided with them equally spaced at the upper turn table, the leak of the polishing slurry through each of the plurality of openings for the measurement can be suppressed, and the maintenance of the turn tables thereby readily carried out. In addition, a risk of a measuring problem of the thickness of the wafer can be suppressed. For example, in the four-way double-side polishing apparatus, it is advantageous to measure the thicknesses of all wafers.

In the case of changing at least one of a polishing load, a rotation speed of the upper turn table 11, a rotation speed of the lower turn table 12 during polishing, the upper turn table 11 and the lower turn table 12 can be controlled by installing a polishing control unit 17 as illustrated in the double-side polishing apparatus 10. The at least one of a polishing load, a rotation speed of the upper turn table 11, a rotation speed of the lower turn table 12 can be thereby changed.

Accordingly, an appropriate response can be made against the changes in polishing conditions due to the deterioration of the polishing jig material such as the polishing pad and the carrier, the changes which are proved from the measured thickness of the wafer during polishing of the wafer. The wafer having a very high flatness on the surface after polishing can be thereby stably obtained.

Figure 10:
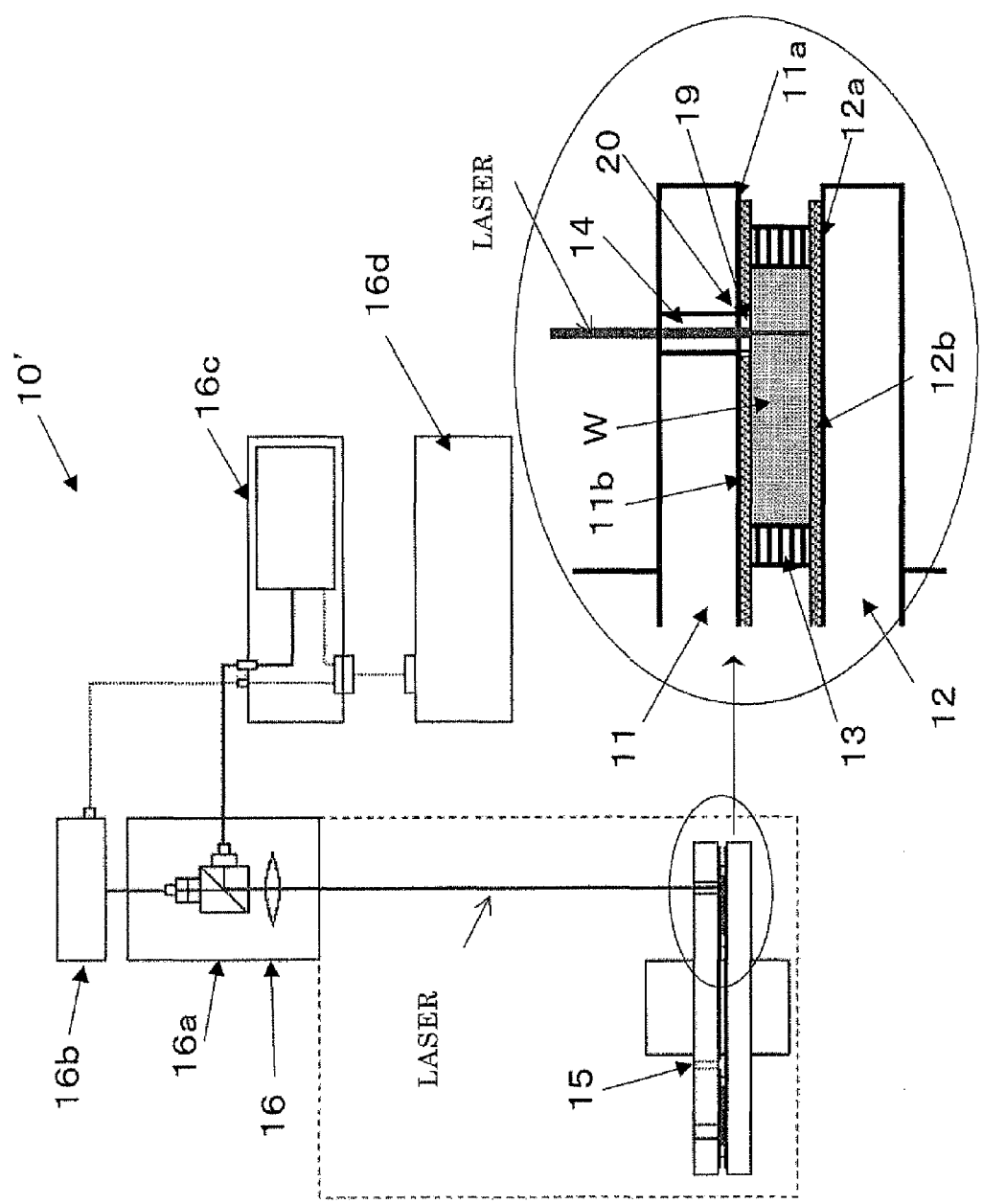
FIG. 10 is a schematic view showing an another example of the double-side polishing apparatus according to the present invention.
Figure 11:
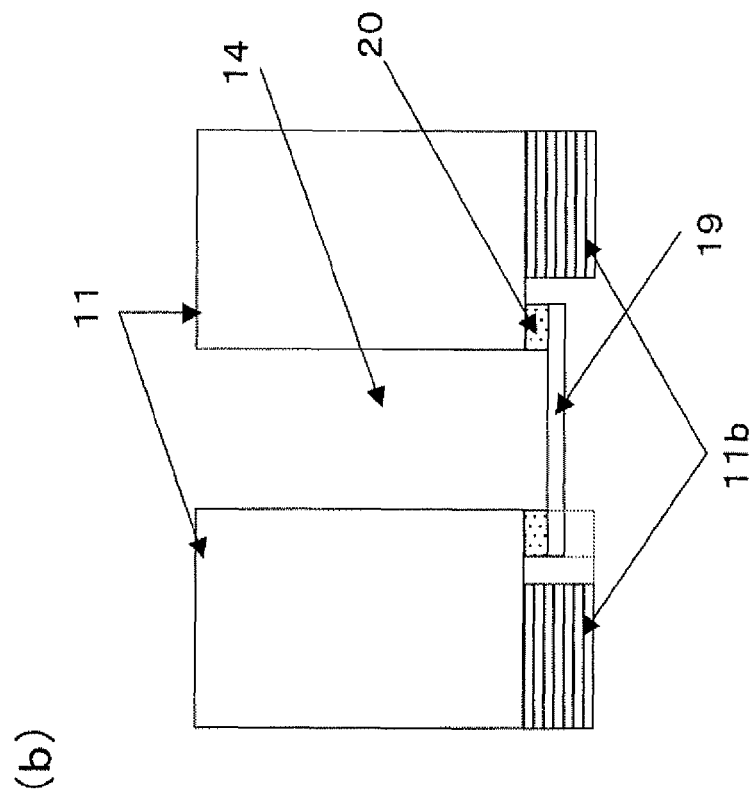
FIG. 11 are views showing an outline of the window member of the present invention (a) and a condition where the window member is adhered to the upper turn table (b)
Figure 11:
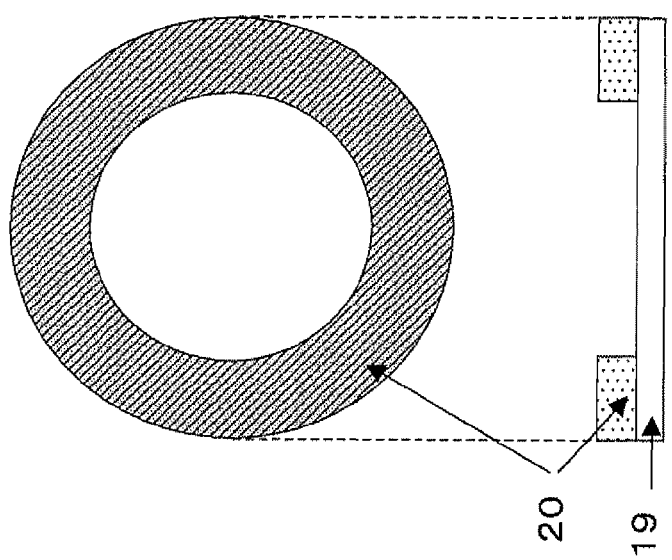

An another preferred embodiment of the double-side polishing apparatus according to the present invention will be explained in detail with reference to FIG. 10, FIG. 11, and FIG. 12. FIG. 10 is a schematic view showing an another example of the double-side polishing apparatus according to the present invention. FIG. 11 are views showing an outline of the window member of the present invention and a condition where the window member is attached to the upper turn table.

The double-side polishing apparatus 10' includes at least: the lower turn table 12 having the flat polishing-upper-surface 12a rotationally driven; the upper turn table 11 having the flat polishing-lower-surface 11a rotationally driven, the upper turn table 11 being arranged with facing to the lower turn table 12; the carrier 13 having the wafer-holding hole for holding the wafer W; the plurality of openings 14 provided at the upper turn table 11; the wafer-thickness-measuring mechanism 16 for measuring the thickness of the wafer W through the plurality of openings 14 during polishing in real time; and the polishing-slurry-supply mechanism 15 for supplying the polishing slurry.

The polishing pad 11b is attached to the polishing surface of the upper turn table 11, the polishing pad being provided with the holes having a diameter larger than that of the openings 14 at positions corresponding to the plurality of openings 14. The polishing pad 12b is attached to the polishing surface of the lower turn table 12. The window members 19 having a diameter larger than that of plurality of the openings 14 and smaller than that of the holes of the polishing pad 11b and having a thickness thinner than that of the polishing pad 11b is attached to the polishing side of the plurality of openings 14 through the adhesion layer 20. The window members 19 are separated from the polishing pad 11b and are fixed to the upper turn table 11 through the adhesion layer 20.

As with FIG. 7, the wafer-thickness-measuring mechanism 16 may have, for example, at least the optical unit 16a for radiating laser to the wafer W, the photo detector 16b for detecting the laser reflected from the wafer W, the laser source unit 16c, and the calculation/control unit 16d for calculating the thickness of the wafer from the detected laser.

Since the above-described double-side polishing apparatus has the structure where the window members and the polishing pad are separated, it is not necessary to scrap the polishing pad having an unexpired lifetime by changing the only damaged window member, and a frequency of changing the polishing pad can be greatly reduced. A waste of the polishing pad can be thereby greatly reduced. In particular, the present invention performs an accurate measurement by providing the plurality of the openings for measuring the thickness of the wafer and the plurality of the windows, and this is therefore strongly demanded.

The double-side polishing apparatus also has the structure where the only window member can be attached to the turn tables. The change is thereby easy, and the maintenance is also easy.

Moreover, by measuring the thickness of the wafer during polishing with the wafer-thickness-measuring mechanism, the polishing can be stopped when the thickness of the wafer during the polishing reaches a target thickness, an occurrence of surface roughness of the wafer due to excess or deficiency of the polishing can be presented, and a flat wafer can be obtained.

Here, an adhesive double coated tape is preferably used as the adhesion layer 20.

The window member can be readily attached by the adhesive double coated tape, and it is low-cost. In addition, since the adhesive double coated tape is thin and its unevenness is small, the variation of an attached angle is so small that it can be ignored. For reasons of this, when an optical system is used as the wafer-thickness-measuring mechanism, an adjustment of the attachment with respect to a light axis is not necessary, and the change becomes easier.

Figure 12:
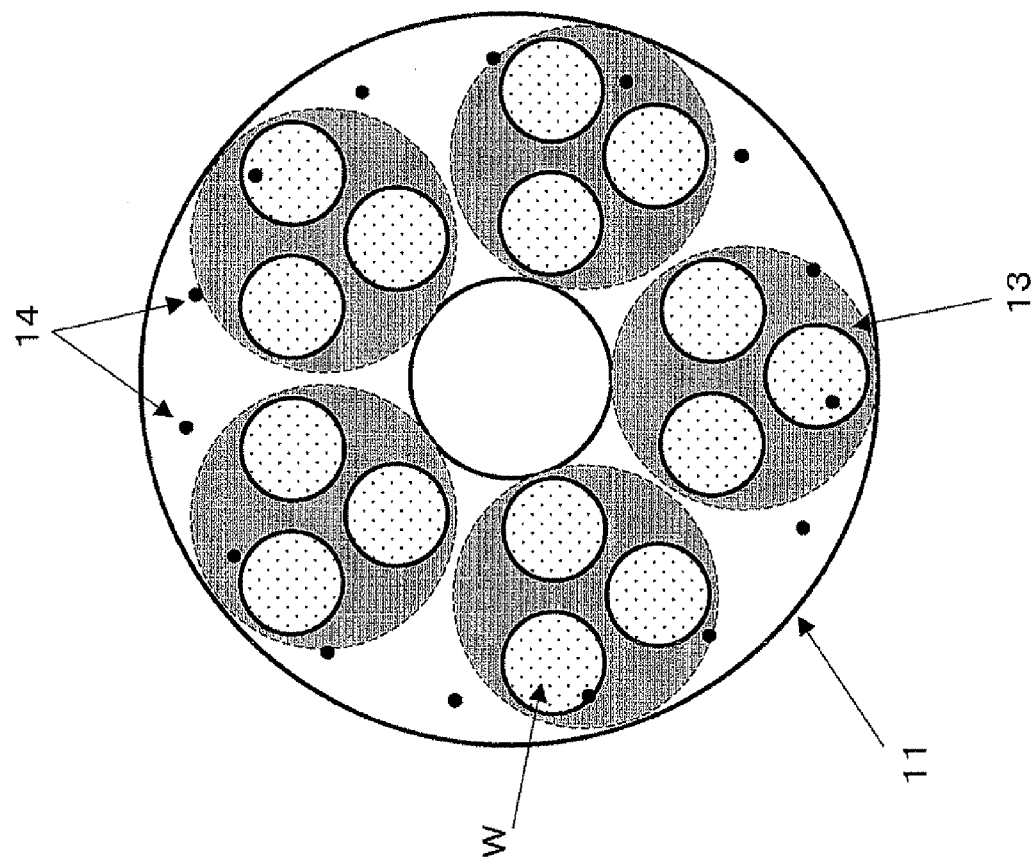
FIG. 12 is a view of the upper turn table and the carrier in an another example of the double-side polishing apparatus according to the present invention, as viewed from a side of the polishing surface.

As shown in FIG. 12, in which the upper turn table 11 and the carrier 13 are shown as viewed from a side of the polishing surface, the plurality of openings 14 can be provided with them equally spaced at the periphery of the upper turn table.

As described above, when the plurality of openings are provided at the upper turn table, that is, the window members are also fixed to the upper turn table, the measure against a slurry leak and the like is not necessary, a splashed polishing slurry can be readily cleaned with water when the window member is changed, and the maintenance becomes easy.

The wafer-thickness-measuring mechanism 16 is desirably fixed to the fixed end except a body of the double-side polishing apparatus 10' in a vertical direction from above the upper turn table 11 or from below the lower turn table 12 of the double-side polishing apparatus 10' with keeping a distance to safely operate for a worker. In this way, the wafer-thickness-measuring mechanism is prevented from rotating together with the upper turn table or the lower turn table, and the wafer-thickness-measuring mechanism can be thereby hard to be influenced by the vibration of the upper and lower turn tables. The thickness of the wafer can be therefore measured with high precision. In addition to this, contamination due to the polishing slurry can be reduced by keeping some distances.

Here, as with FIG. 7, the wafer-thickness-measuring mechanism can measure the bulk thickness of the wafer.

When the thickness of the wafer measured with the wafer-thickness-measuring mechanism is the bulk thickness, an actual thickness of the wafer during polishing is measured, and the thickness of the polished wafer can be therefore made closer to a target thickness.

As with FIG. 7, the wafer-thickness-measuring mechanism can have the apparatus of the wavelength-variable-infrared laser having a light transmittable wavelength through the wafer.

As described above, when the apparatus of a wavelength-variable-infrared laser having a light transmittable wavelength through the wafer is used as the wafer-thickness-measuring mechanism, a situation can be analyzed, in which front-surface reflecting light reflected from the front surface of the wafer and back-surface reflecting light reflected from the back surface of the wafer, out of the input laser to the wafer, are interfered. The thickness of the wafer can be thereby measured during polishing with precision of an order of magnitude of a few nanometers to some dozen micrometers.

In addition to this, when the apparatus of the wavelength-variable-infrared laser is used, a great difference of the thickness of the wafer to be polished can be managed by changing the wavelength of the laser to be input, and the light source itself does not need to be changed. The cost can be thus reduced.

Moreover, the window members can be light transmittable by the laser radiated from the apparatus of a wavelength-variable-infrared laser.

As described above, when the window members is light transmittable by the laser, a decrease in strength of the measuring laser due to the absorption and reflection of the laser by the window members can be suppressed. The thickness of the wafer can be thereby measured with higher precision.

The window members can be made of plastic. Here, this window members made of plastic include a film made of plastic.

This window members made of plastic has excellent steadiness, and a frequency of changing the window member can be thereby reduced. In addition, since it is low-cost, the cost required for the change can be reduced.

Here, the relation of $t_1 \times \xi_1 \times P/100 > t_w + t_2$ and the relation of $t_w n_w > t_s n_s$ or $t_w n_w < t_s n_s$ can be satisfied, when a thickness of each of the window members is $t_w$ [μm], a refractive index of each of the window members is $n_w$, a thickness of the adhesion layer is $t_2$ [μm], a thickness of the wafer is $t_9$ [μm], a refractive index of the wafer is $n_s$, a thickness of the polishing pad is $t_1$ [μm], a compressibility of the polishing pad is $\xi_1$ [%/g/cm$^2$], a maximum polishing load is P [g/cm$^2$].

As described above, when the relation of $t_1 \xi_1 \times P/100 > t_w + t_2$ is satisfied, the protruding of the window members from the polishing pad in the direction of the thickness can be suppressed during polishing, and the deterioration of the flatness of the wafer at the window members can be suppressed. The wafer having an excellent flatness can be therefore obtained.

In addition, when the relation of $t_w n_w > t_s n_s$ or $t_w n_w < t_s n_s$ is satisfied, it can be suppressed that detected strength is decreased by the overlap between peaks of the reflection light at the window members and the reflection light at the wafer, for example, in the case of using laser for the measurement of the thickness of the wafer. The thickness of the wafer can be therefore measured with higher precision.

Hereinafter, the wafer polishing method according to the present invention by using the above-described double-side polishing apparatus will be explained in detail. However, the present invention is not restricted thereto.

First, the wafer to be polished is set to the carrier.

The wafer is held with the polishing-lower-surface of the upper turn table, polishing-upper-surface of the lower turn table, and the carrier, and the polishing is started while supplying the polishing slurry and rotating the upper turn table and the lower turn table in a horizontal plane.

In this case, the polishing is performed while measuring the thickness of the wafer through the plurality of openings provided at the upper turn table or the lower turn table.

The thickness of the wafer can be thereby seen during the polishing without stopping the polishing and in particular the thickness of the wafer during the polishing can be seen at any time. Whether the thickness reaches to a target thickness of the wafer can be thereby judged while performing the polishing. That is, whether the thickness reaches to a target thickness of the wafer can be judged without stopping the polishing, and the time required for the polishing can be consequently reduced.

In addition to these, since the wafer can be polished into a target thickness without predetermining the polishing time, the excess or deficiency of the polishing does not occur, and the deterioration of the flatness can be suppressed. That is, this can also manage the deterioration of the polishing pad and the like.

In the wafer polishing method according to the present invention, the polishing slurry is switched with a polishing slurry having a different polishing rate with a certain timing.

For example, the wafer is roughly polished at a high rate with the polishing slurry having a high polishing rate at the beginning of the polishing (a condition of a high polishing rate). Thereafter, it is changed, for example, when the thickness of the wafer becomes a target thickness γ. In this change, the polishing slurry is switched with a polishing slurry having a low polishing rate during the polishing to precisely polish the wafer at a low rate (a condition of a low polishing rate).

The polishing method as described above enables a total time required for polishing the wafer to be reduced. The polishing in a finishing stage is performed after changing with the polishing slurry having a high polishing precision, and the flatness of the polished wafer is not thereby sacrificed. The wafer having a high flatness and a high smoothness can be therefore obtained at high productivity.

In this case of the present invention, the thickness of the wafer is measured through the plurality of openings. Therefore, even when a plurality of wafers are simultaneously polished in a batch-wise manner, the thicknesses of all wafers can be measured, the thicknesses can be measured with high precision, and the polishing can be thereby performed with high precision.

Here, the thickness of the wafer can be measured through the plurality of openings provided at the upper turn table.

When the thickness of the wafer is measured through the plurality of openings provided at the upper turn table, the openings can be arranged above the wafer, the leak of the polishing slurry can be thereby suppressed. The measure against the leak is not therefore necessary, and the maintenance of the turn tables consequently becomes easy. Also, the thickness of the wafer can be of course measured through the plurality of openings provided at the lower turn table.

The method of measuring the thickness of the wafer can be an optical reflection interferometry by a wavelength-variable-infrared laser.

The thickness of the wafer can be measured with high precision by the above-described optical reflection interferometry, in which wavelength dispersion of the reflection (a reflection spectrum: a situation of interference of light reflected from a front surface and a back surface of the wafer) is reconfigured from reflection strength of highly wavelength-swept "wavelength-variable-infrared laser" on the surface of the wafer, and a frequency analysis is carried out.

In the present invention, the timing of the switching of the polishing slurry can be determined on the basis of at least one of the elapsed time from the start of the polishing, the polishing rate, the polishing stock removal, and the lifetime of a polishing pad.

The polishing conditions, such as the polishing rate of the wafer, vary due to the deterioration of the polishing jig material such as the polishing pad and the carrier.

However, in the present invention, the polishing is performed while accurately measuring the thickness of the wafer through the plurality of openings one by one. Therefore, an appropriate response can be made according to circumstances against small changes in the polishing conditions of the wafer by using the lifetime of the polishing pad, the elapsed time from the start of the polishing, the polishing rate, the polishing stock removal for determining the timing of the switching of the polishing slurry. The shape of the polished wafer can be thereby stably made flat with high precision, and particularly the outer peripheral sag can be improved. In addition to this, the thickness of the wafer can be readily made a target thickness.

Moreover, at least one of the polishing load, the rotation speed of the upper turn table, and the rotation speed of the lower turn table can be changed during the polishing of the wafer on the basis of measured data of the thickness of the wafer.

As described above, when at least one of the polishing load, the rotation speed of the upper turn table, and the rotation speed of the lower turn table is changed during polishing, in addition to the switching with the slurry having a different polishing rate during the polishing, the polishing rate and the like can be minutely and freely changed during the polishing. An appropriate response can be therefore made against the changes in the polishing conditions during the polishing of the wafer. The wafer having a very high flatness on the surface after polishing can be consequently obtained.

In the present invention, the wafer can be polished in a batch-wise manner.

The wafer polishing method according to the present invention enables a flat wafer to be manufactured at high productivity. The productivity can be more improved by polishing in a batch-wise manner.

Here, the case of changing the timing of the switching of the polishing slurry on the basis of the lifetime of the polishing pad will be explained in detail with reference to the drawings, but the present invention is not of course restricted thereto.

As mentioned above, the timing of the switching can be also changed on the basis of the elapsed time from the start of the polishing, the polishing rate, the polishing stock removal, and can be of course changed by combining these.

Figure 1:
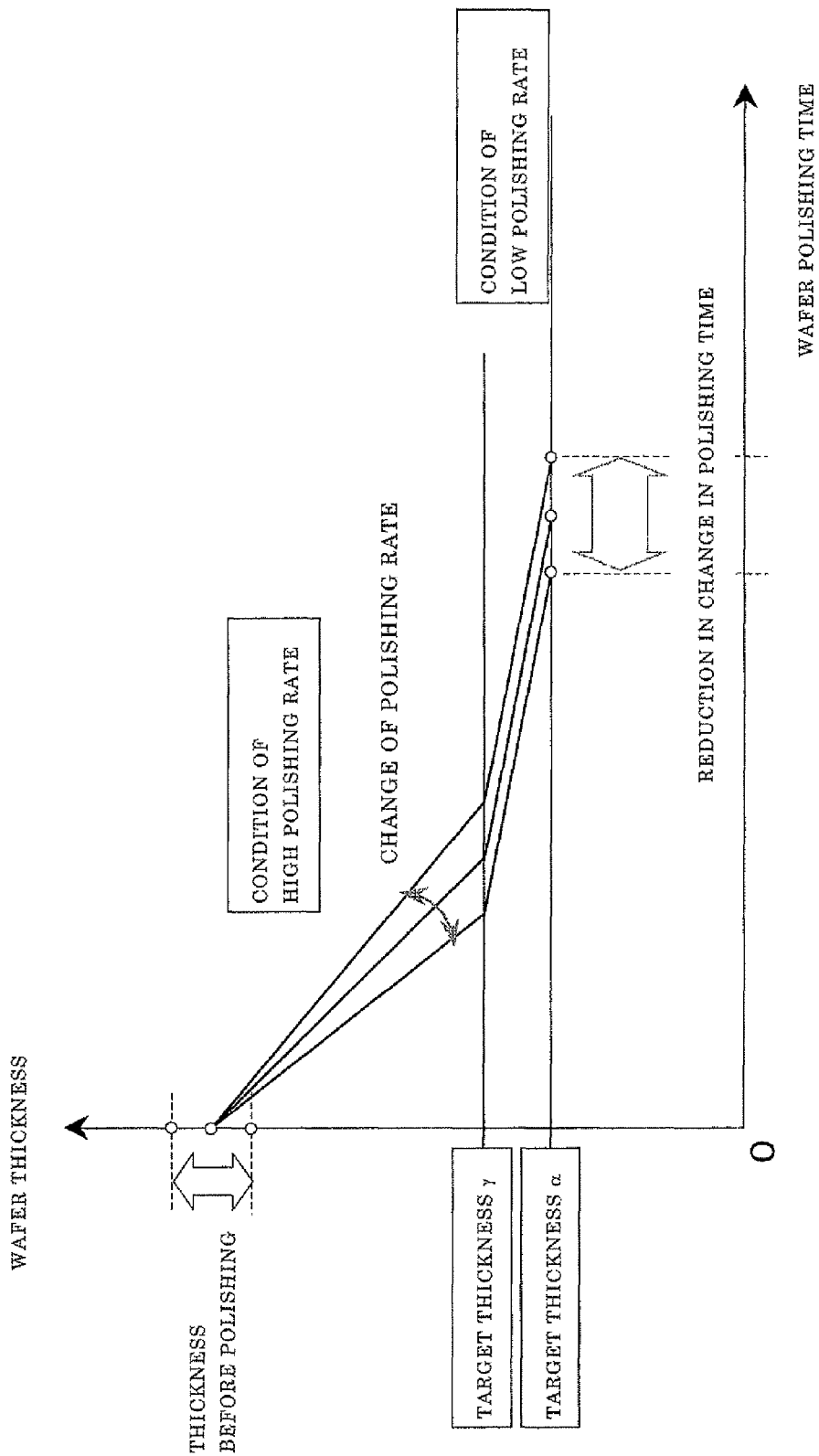
FIG. 1 is a view showing an example of a relationship between an elapsed time from the start of polishing the wafer and the thickness of the wafer in case of switching on the basis of a target thickness, in the wafer polishing method according to the present invention.

FIG. 1 will be first explained. FIG. 1 is a view showing an example of the relationship between the elapsed time from the start of polishing the wafer and the thickness of the wafer in case of determining the timing of the switching on the basis of a target thickness, in the wafer polishing method according to the present invention.

As described above, since the polishing is performed while measuring the thickness at any time, the slurry can be surely changed at a predetermined target thickness, and the wafer having the thickness with no variation can be finally obtained.

In this case, when high rate polishing in a first stage is performed at a high rate, it reaches predetermined polishing stock removal (a target thickness γ) for a short time, but since the polish is performed at a high rate, the shape of the wafer is apt to deteriorate. Therefore, the shape fundamentally needs to be adjusted by performing low rate polishing in a second stage for a long time. On the other hand, when the polishing rate of the high rate polishing in a first stage is decreased due to the deterioration of the polishing pad, it takes a long time to reach a predetermined thickness, but the wafer shape fundamentally becomes good. The wafer shape can be finished for a short time by the low rate polishing in a second stage. However, in the case of switching the slurry only on the basis of the target thickness or the polishing stock removal as described above, the deteriorated shape in the first stage cannot be completely repaired by the second stage in some cases, the first and second polishing may be performed for an excessively long time, and thus further improvement is required.

Figure 2:
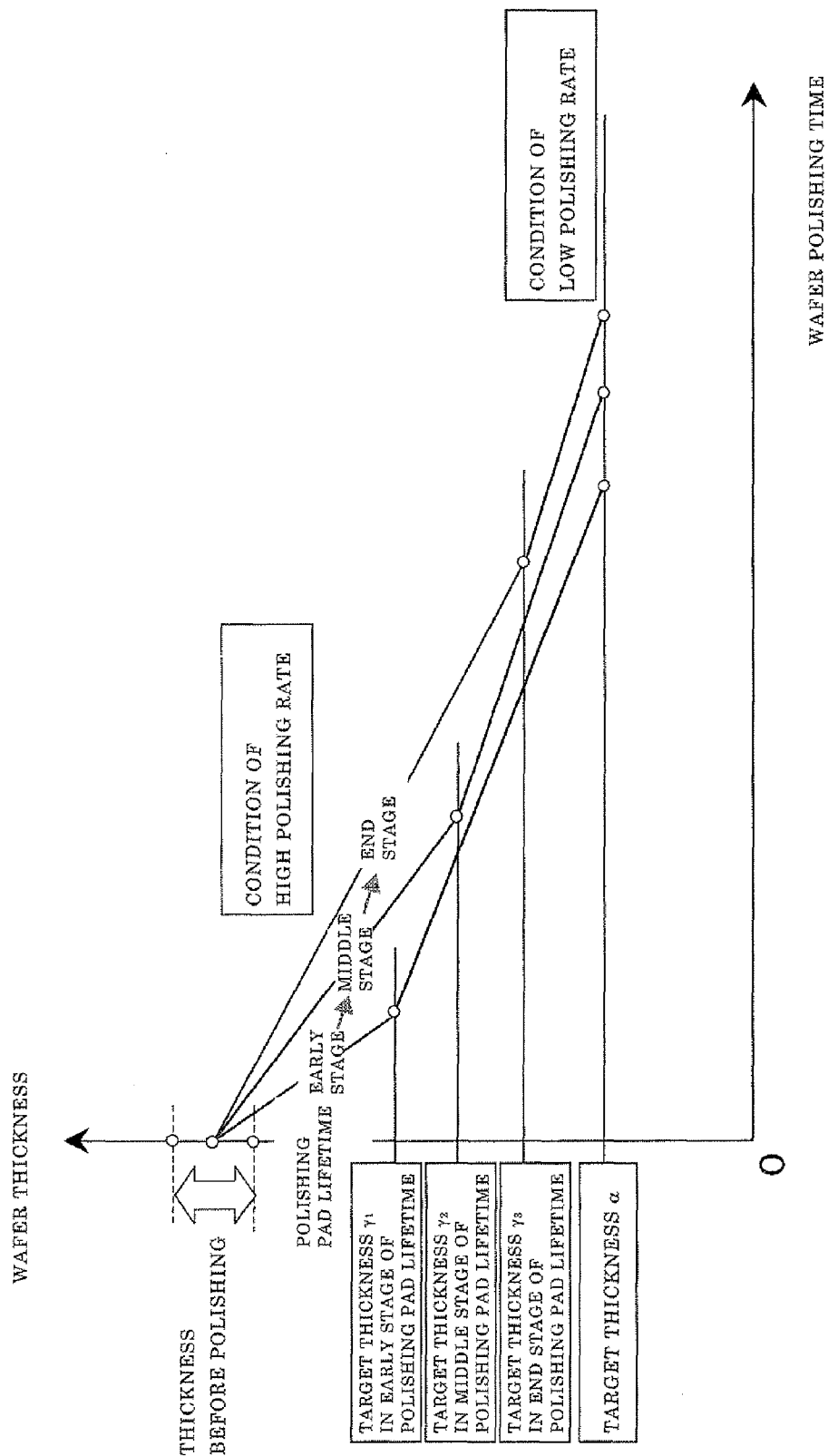
FIG. 2 is a view showing an another example of a relationship between an elapsed time from the start of polishing the wafer and the thickness of the wafer, in the wafer polishing method according to the present invention.

In view of this, for example as shown in FIG. 2, a ratio of the target thickness α for the finishing to the target thickness γ for a first polishing slurry can be automatically changed according to the deterioration of the polishing pad. It is to be noted that the target thickness α is the same as that in FIG. 1.

This deterioration of the polishing pad is determined by the polishing rate calculated from the thickness data obtained by the measurement of the thickness during the polishing. In addition, the relationship between the polishing rate and a total polishing time is accumulated by using the same type of polishing pad in advance, and a correspondence table of an average polishing rate and the total polishing time, and switching conditions of the polishing slurry having a high rate and the polishing slurry having a low rate can be preliminarily made.

In this case, the polishing of the wafer is first started, and the polishing rate and the total polishing time are monitored at any time by measuring the thickness of the wafer during the polishing. Then, the target thickness γ can be automatically changed appropriately with reference to the known correspondence table and condition table.

For example, since the polishing rate is high in an early stage of the lifetime when the polishing pad is started to use, it is polished at a higher rate by using the polishing slurry having a high polishing rate. The target thickness γ is accordingly set to be as thin as possible, and for example, it is set at $\gamma_1$. When it is stabilized after a certain time passes, the polishing stock removal by the polishing slurry having a high polishing rate is increased, and it is set at $\gamma_2$, for example. When the lifetime is close to the end due to process of the deterioration of the polishing pad and the polishing rate starts to decrease, the target thickness for the polishing slurry having a high polishing rate is set, for example, at $\gamma_3$ so as to increase the polishing stock removal for the polishing slurry having a high polishing rate.

The above-described wafer polishing method enables the changes in the polishing conditions at a polishing area by the same polishing slurry to be flexibly managed, the changes which are caused by the deterioration of the polishing pad. The change in processing time of the wafer can be therefore suppressed, and throughput can be consequently improved. In the early stage of the lifetime of the polishing pad, the polishing stock removal under a condition of a high polishing rate is made as small as possible, and the deterioration of the flatness by the high rate polishing can be thereby prevented. In an end stage of the lifetime of the polishing pad, the polishing stock removal under a condition of the decrease in the polishing rate in comparison with the early stage of the lifetime of the polishing pad can be increased by the relation of a tradeoff. The polishing time under a condition of a low polishing rate can be reduced, and it can be consequently suppressed that a total polishing time becomes long. Furthermore, the flatness and the smoothness of the wafer can be made high, and such a wafer can be stably obtained.

EXAMPLE

Hereinafter, the present invention will be explained in more detail based on Examples and Comparative Examples, but the present invention is not restricted thereto.

Example 1

A wafer was polished according to the wafer polishing method as shown in FIG. 1.

As the wafer to be polished, there were prepared 720 silicon single wafers having a diameter of 300 mm and p⁻-type obtained by slicing, with a wire saw, an ingot grown by the CZ method. This p⁻-type wafer means a p-type wafer having a high resistivity. The wafers were subjected to chamfering, rapping, and etching in a normal condition.

With the double-side polishing apparatus as shown in FIG. 7, 240 wafers of the prepared silicon single wafers were double-side polished in a batch-wise manner (15 wafers in one batch). As the polishing pad, MH-S15A of Nitta haas was used. As the polishing slurry before the switching, Fujimi FGL11022 (for the high rate polishing) was used, and as the polishing slurry after the switching, Fujimi FGL2100 (for the low rate polishing) was used. It is to be noted that an attempt to keep the thicknesses of all polished wafers constant was made.

In this case, the thicknesses of the wafers were measured through the plurality of openings during the polishing to calculate the polishing rate of the wafer at any time, and the relationship between an average rate and the total polishing time every number of the polishing was saved, and past values were referred and compared to switch the polishing slurry when the thickness of the wafer became a predetermined thickness.

When the lifetime of the polishing pad was T, the timing of the switching of the polishing agent was classified as an early stage of the polishing pad: T/5, a middle stage: 2T/5 to 4T/5, an end stage: 4T/5 to 5T/5.

The polishing was performed while a ratio of the polishing stock removal for the polishing slurry before the switching and the polishing slurry after the switching was changed so as to be 2.75:1, 6.5:1, and 14:1 according to the classification of the lifetime of the polishing pad.

According to this method, 240 wafers were polished with the identical apparatus, and the flatness of each of the polished surfaces was evaluated by AFS (a capacitance flatness-measuring apparatus made of ADE co.,).

Comparative Example 1

Figure 5:
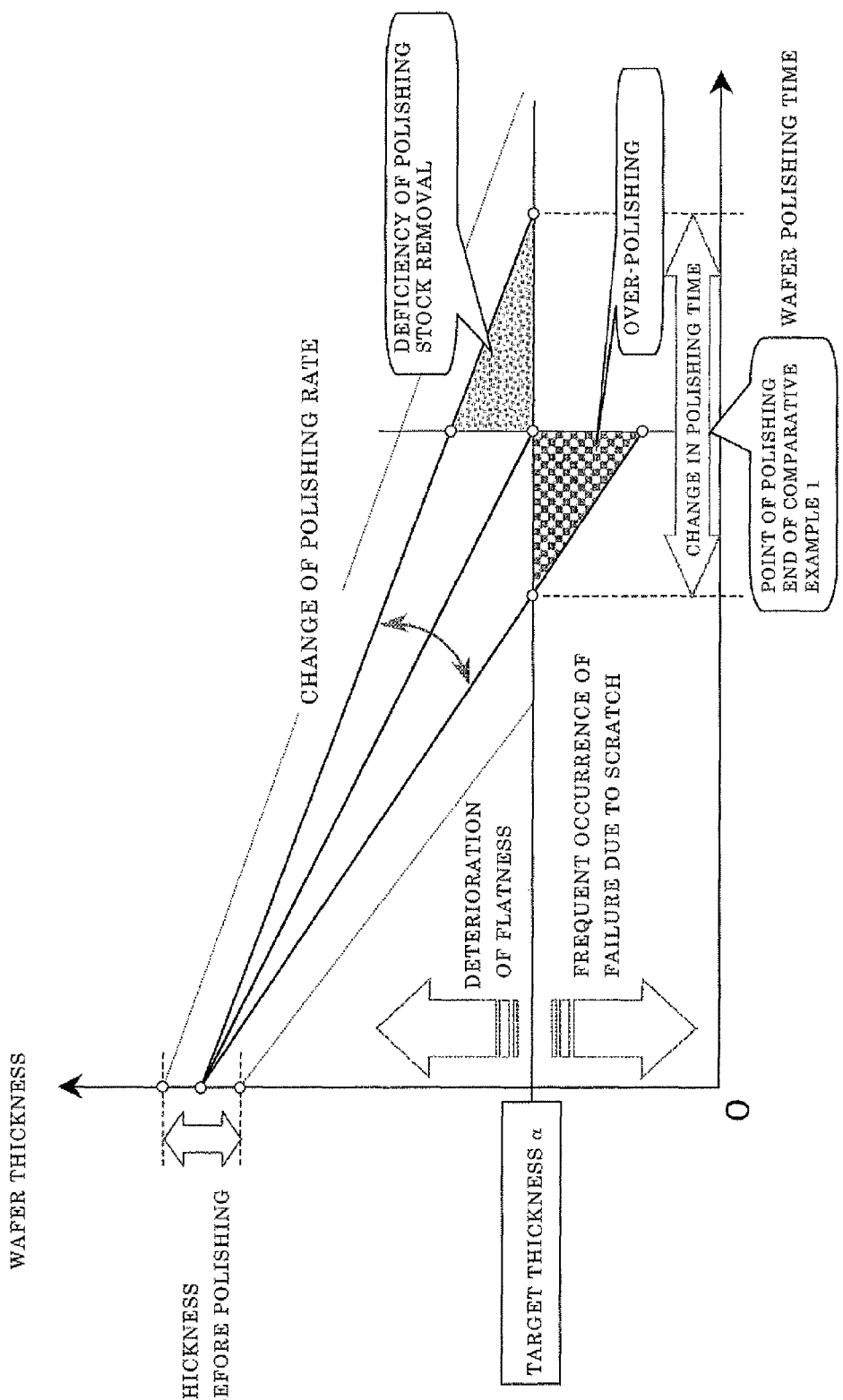
FIG. 5 is a view showing an example of a relationship between an elapsed time from the start of polishing the wafer and the thickness of the wafer, in a conventional wafer polishing method.

In FIG. 5, 240 wafers of 720 prepared wafers were polished in the same condition as Example 1 except that the polishing time was made constant without the switching the polishing slurry during polishing and an occurrence of deficiency of the polishing or the over-polishing was not avoided, and the same evaluation was carried out.

Comparative Example 2

Figure 6:
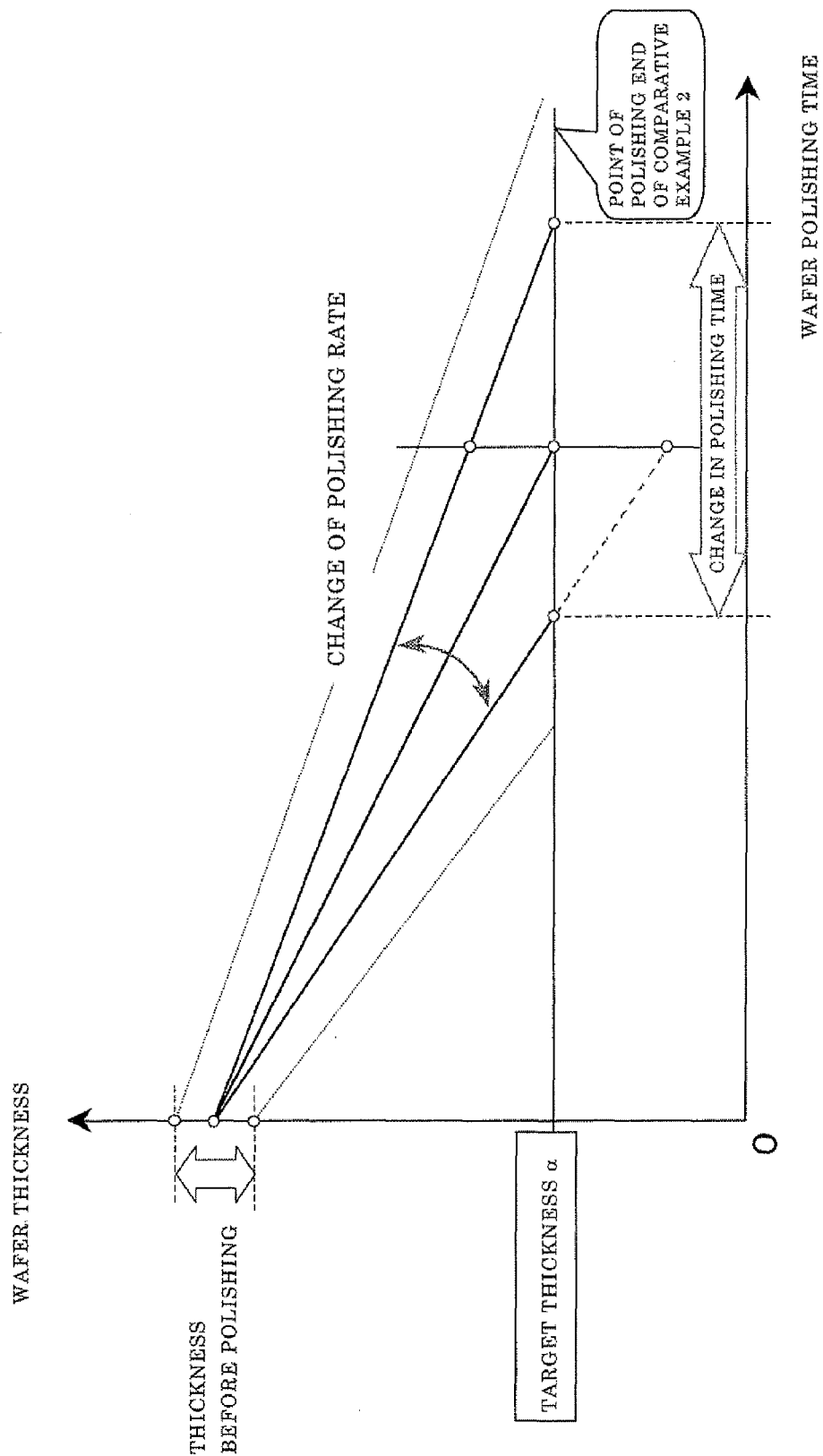
FIG. 6 is a view showing an another example of a relationship between an elapsed time from the start of polishing the wafer and the thickness of the wafer, in a conventional wafer polishing method.

As shown in FIG. 6, the other 240 wafers were polished in the same condition as Example 1 except that the polishing was performed while measuring the thickness of the wafer to achieve a constant target thickness α for the wafer after the polishing and that the polishing slurry was not changed during the polishing, and the same evaluation was carried out.

Figure 3:
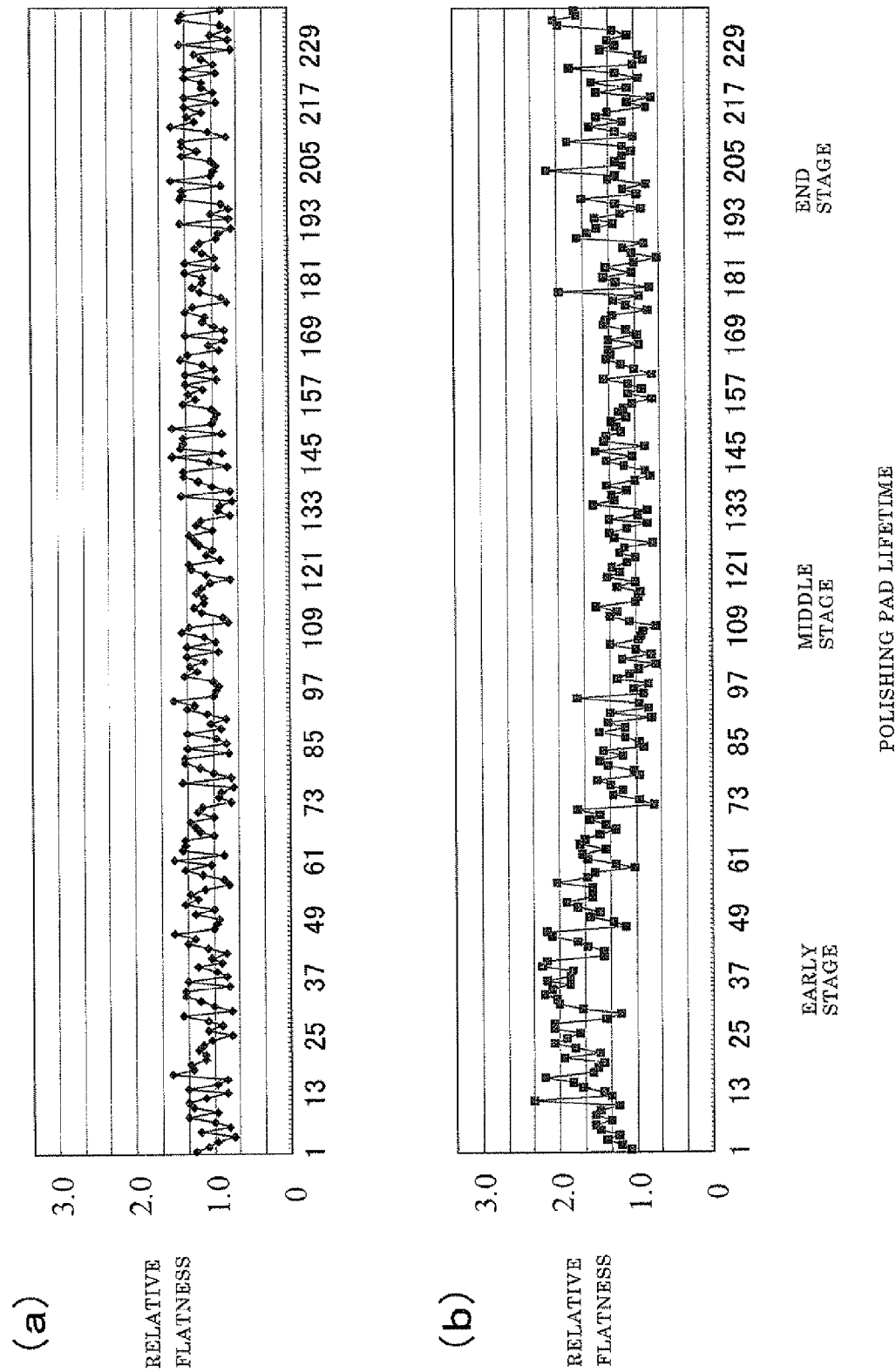
FIG. 3 is a view of comparing the flatness of the wafers polished by the wafer polishing method of Example 1 of the present invention and Comparative Example 2.

As a result, as shown in FIG. 3(a), it was revealed that the variation of each of the wafers was small and the polishing was performed with high precision in the wafer polishing method of Example 1. On the other hand, as shown in FIG. 3(b), each of the polished wafers had the variation of the flatness due to the lifetime of the polishing pad and thereby the polishing was not stably performed in the wafer polishing method of Comparative Example 2. The variation in the wafer polishing method of Comparative Example 1, although this is not shown, was larger than that of Comparative Example 2.

Figure 4:
FIG. 4 is a view showing by a contour line a surface shape of the wafer in Example 1 of the present invention and Comparative Example 2.
Figure 4:
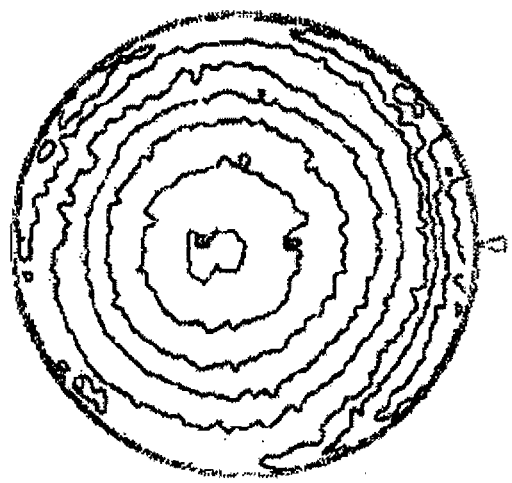

As shown in FIG. 4(a), a surface shape of the wafer polished by the wafer polishing method of Example 1 was uniform in a plane, and the outer peripheral sag was removed. On the other hand, as shown in FIG. 4(b), it was revealed that a surface shape of the wafer polished by the wafer polishing method of Comparative Example 2 had distribution in a plane, and it was not uniformly polished.

Here, in Table 1, there is shown a ratio of manufacturing capability to the lifetime of the polishing pad in Example 1 and Comparative Examples when the lifetime of the polishing pad in the wafer polishing method of Comparative Example 2 is 100.

TABLE 1

| MANUFACTURING CAPABILITY (%) | LIFETIME OF POLISHING PAD | | |
|---|---|---|---|
| | EARLY STAGE | MIDDLE STAGE | END STAGE |
| COMPARATIVE EXAMPLE 1 | 93 | 97 | 89 |
| COMPARATIVE EXAMPLE 2 | 95 | 100 | 84 |
| EXAMPLE 1 | 103 | 101 | 100 |

As shown in Table 1, the wafer polishing method of Example 1 has higher manufacturing capability regardless of the lifetime of the polishing pad in comparison with the case of the middle stage of the lifetime of the polishing pad of Comparative Example 2, and the productivity is increased by 10% in comparison with Comparative Example 2.

On the other hand, it is revealed that both of the manufacturing capability of Comparative Example 1 and 2 are influenced by the lifetime of the polishing pad and are unstable.

Example 2

The double-side polishing apparatus as shown in FIG. 7 was used to polish the wafers in a batch-wise manner (15 wafers in one batch). In this case, the target thickness of each of the polished wafers was 777 µm.

As the wafer to be polished, there were prepared 600 silicon single wafers having a diameter of 300 mm and p⁻-type obtained by slicing, with a wire saw, an ingot grown by the CZ method. The wafers were subjected to chamfering, lapping, and etching. This p⁻-type wafer means a p-type wafer having a high resistivity.

There was prepared the wafer-thickness-measuring mechanism provided with the optical unit using the apparatus of a wavelength-variable-infrared laser, the apparatus which can tune the wavelength of the laser to 1575 to 1775 nm. With this wafer-thickness-measuring mechanism, 300 wafers of 600 wafers were polished while measuring the thickness of the wafer, and the thickness of each of the polished wafers was evaluated by AFS (a capacitance flatness-measuring apparatus made of ADE co.,).

Comparative Example 3

The same double-side polishing apparatus as Example 2 was used to polish the other 300 wafers. In Comparative Example 3, however, the polishing was performed without operation of the wafer-thickness-measuring mechanism. The polishing time was determined in advance.

Figure 8:
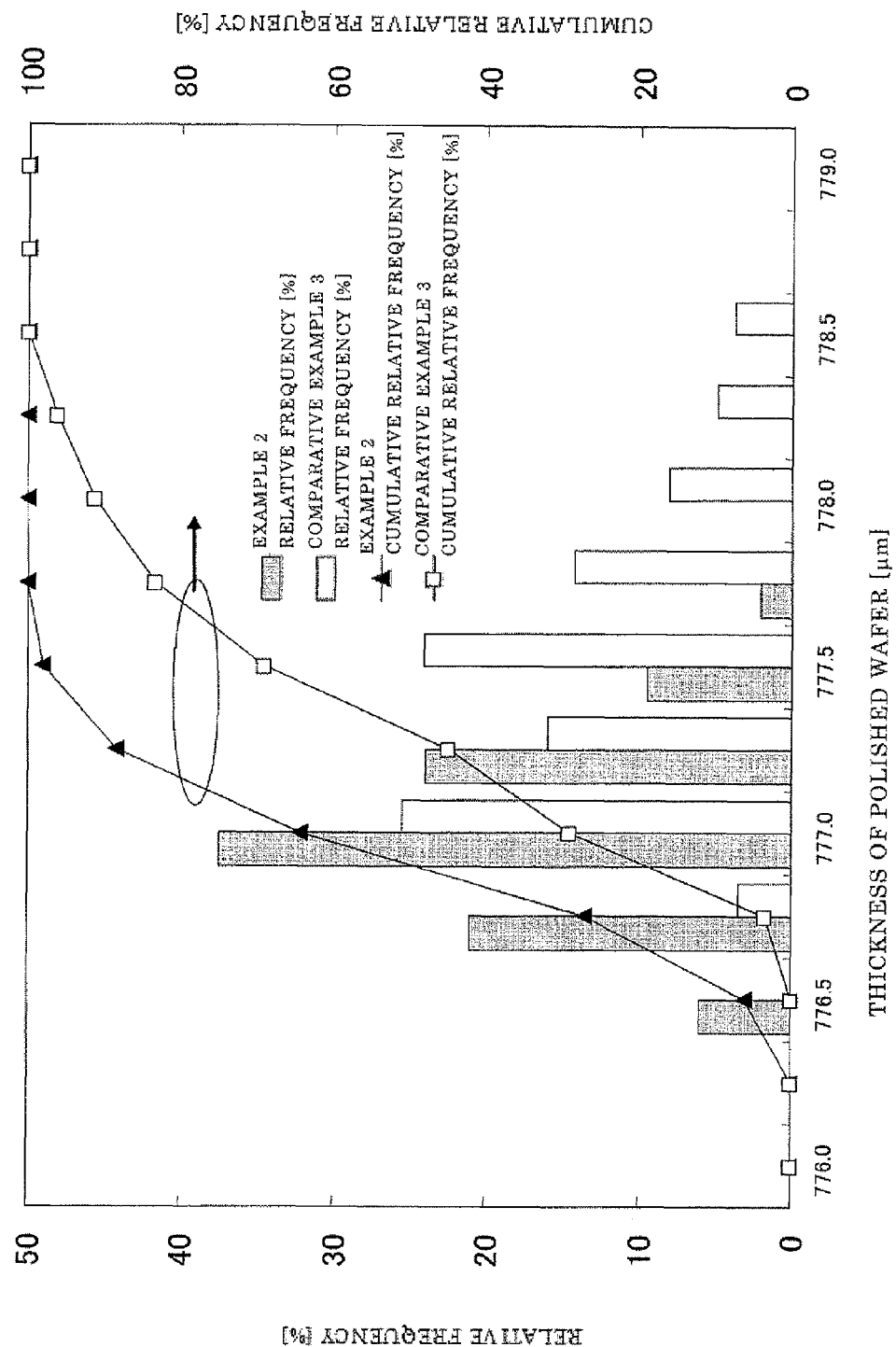
FIG. 8 is a graph showing a relative frequency and a cumulative relative frequency of the thicknesses after polishing of 300 wafers polished with the double-side polishing apparatus in Example 2 and Comparative Example 3.

FIG. 8 shows a relative frequency and a cumulative relative frequency of the thicknesses after the polishing of 300 wafers polished with the double-side polishing apparatus of Example 2 and Comparative Example 3.

It was revealed that, in each of the wafers polished with the double-side polishing apparatus of Example 2, the variation of an average finishing thickness after the polishing was small in comparison with each of the wafers of Comparative Example 3 and decreased by approximately 50%.

It was also revealed that the precision of standard deviation of 0.1 μm or less was able to be achieved according to the double-side polishing apparatus of Example 2.

Figure 9:
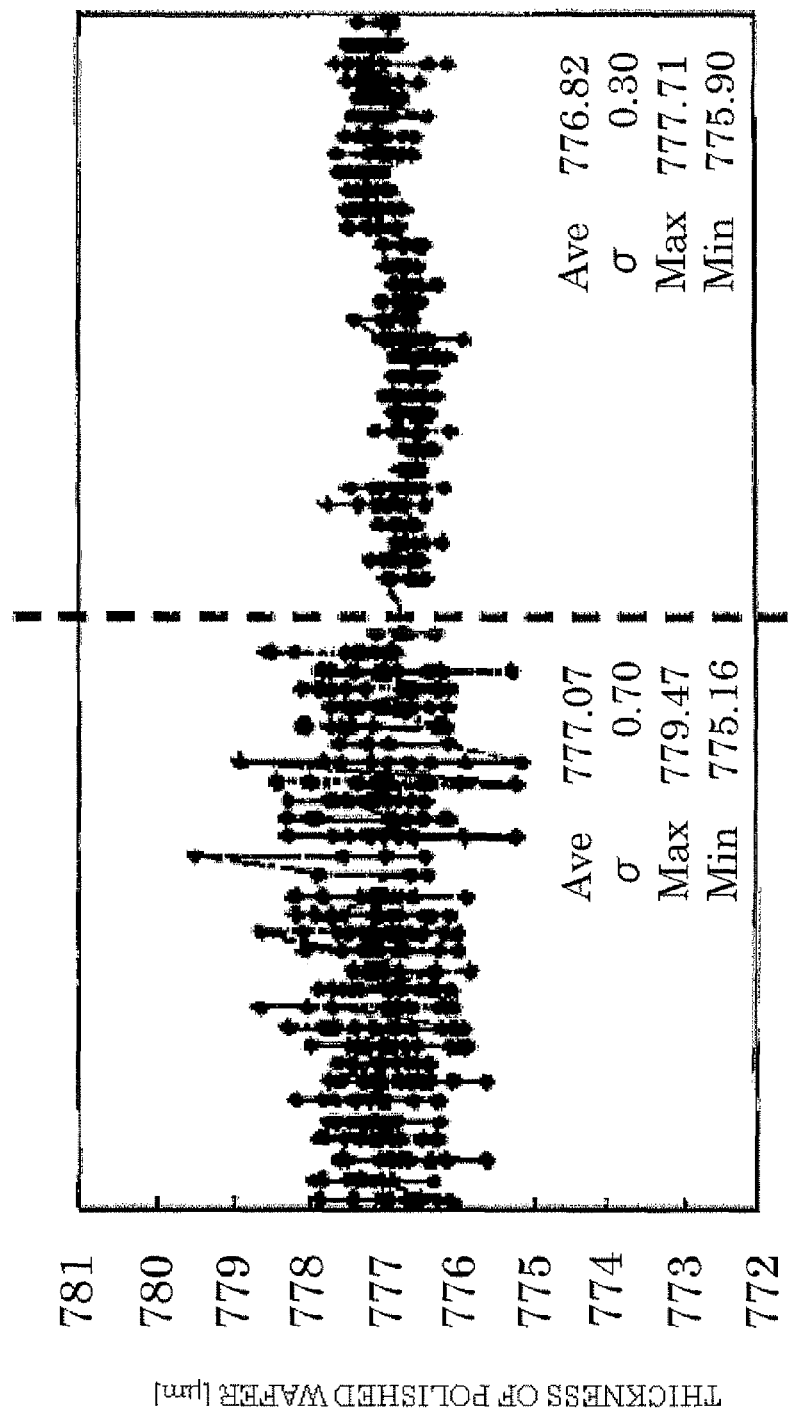
FIG. 9 is a graph showing the variation of the thicknesses after polishing of wafers polished with the double-side polishing apparatus in Example 2 and Comparative Example 3.

As shown in FIG. 9, in each of the wafers polished with the double-side polishing apparatus of Example 2, the thickness of each of the polished wafers was stable. On the other hand, each of the wafers of Comparative Example 3 had a large variation and was unstable.

Example 3

The double-side polishing apparatus as shown in FIG. 10 was prepared.

First, 15 openings having a diameter of 20 mm were provided on the circumference of a circle where the center of the upper turn table is a fulcrum, as the plurality of openings. The polishing pad (polishing pad MH made by Nitta Naas co., a thickness of 1500 μm) having the holes having a diameter of 20 mm larger than that of an outer circumferential portion of each of the openings (a diameter of 40 mm) was prepared. The same number of the window members as the openings were also prepared, each window member in which PTS films made by toray co., (a diameter of 30 mm, a thickness of 150 μm) having a diameter of 10 mm larger than that of each of the openings provided at the turn table were cut into the shape of a circular disk, and adhesive double coated tapes (sumitomo 3M 442JS3, a thickness of 110 μm) were adhered along the outer circumference of the PTS films. The window members were adhered to portions of the openings of the upper turn table by adhesive double coated tapes.

As the wafer to be polished, there were prepared 1000 silicon single wafers having a diameter of 300 mm and p⁻-type obtained by slicing, with a wire saw, an ingot grown by the CZ method. The wafers were subjected to chamfering, lapping, and etching. This p⁻-type wafer means a p-type wafer having a high resistivity.

There was prepared the wafer-thickness-measuring mechanism having the optical unit using the apparatus of a wavelength-variable-infrared laser, the apparatus which can tune the wavelength of the laser to 1575 to 1775 nm. With this wafer-thickness-measuring mechanism, 1000 wafers were polished in a batch-wise manner (15 wafers in one batch) while measuring the thickness of the wafer.

The surface shape of each of the polished wafers polished with the above-described double-side polishing apparatus was evaluated by AFS (a capacitance flatness-measuring apparatus made of ADE co.,). As a result, the variation was small in comparison with, for example, a conventional polishing apparatus in which the polishing pad and the window members are unified, and flat wafers were able to be obtained.

The deterioration of each of the window members did not vary so much from a conventional case, and a frequency of changing the window member did not also vary. However, a frequency of changing the polishing pad became approximately one half of the conventional case. As mentioned above, the waste can be avoided in comparison with a conventional method and apparatus, and the cost of the polishing pad was able to be reduced.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A wafer polishing method including simultaneously polishing both surfaces of a wafer by providing an upper turn table having a flat polishing-lower-surface so as to face toward a lower turn table having a flat polishing-upper-surface; providing polishing pads attached to the respective upper and lower turn tables; holding the wafer with the upper turn table, the lower turn table, and a carrier having a wafer-holding hole for holding the wafer; and pressing and rubbing the wafer while the upper turn table and the lower turn table are rotationally driven, wherein:

the polishing is performed while supplying a polishing slurry from above the held wafer and measuring a thickness of the wafer through a plurality of openings provided between a rotation center and an edge of the upper turn table or the lower turn table, switching the polishing slurry with a polishing slurry having a different polishing rate during the polishing of the wafer, and a timing of the switching of the polishing slurry is determined on the basis of a lifetime of the polishing pads.

2. The wafer polishing method according to claim 1, wherein the plurality of openings are provided in the upper turn table.

3. The wafer polishing method according to claim 2, wherein a plurality of the wafers are polished in a batch-wise manner.

4. The wafer polishing method according to claim 3, wherein a wavelength-variable-infrared laser is used for measuring the thickness of the plurality of the wafers by optical reflection interferometry.

5. The wafer polishing method according to claim 1, wherein a plurality of the wafers are polished in a batch-wise manner.

6. The wafer polishing method according to claim 1, wherein a wavelength-variable-infrared laser is used for measuring the thickness of the wafer by optical reflection interferometry.

7. The wafer polishing method according to claim 1, wherein at least one of a polishing load, a rotation speed of the upper turn table, and a rotation speed of the lower turn table is changed during the polishing of the wafer on the basis of measured data of the thickness of the wafer.

8. The wafer polishing method according to claim 1, wherein the lifetime of the polishing pads is determined based on a polishing rate calculated from thickness data obtained by the measurement of the thickness of the wafer during polishing.

9. A wafer polishing method for simultaneously polishing both surfaces of a wafer in a double-side polishing apparatus having polishing pads, an upper turn table and a lower turn table, the wafer polishing method comprising:

supplying a first polishing slurry to the wafer;

measuring a thickness of the wafer through a plurality of openings provided between a rotation center and an edge of the upper turn table or the lower turn table;

determining a lifetime of the polishing pads; and switching the first polishing slurry with a second polishing slurry having a different polishing rate from the first polishing slurry during the polishing of the wafer at a timing that is based on the determination of the lifetime of the polishing pads.

10. The wafer polishing method according to claim 9, wherein the plurality of openings are disposed in the upper turn table.

11. The wafer polishing method according to claim 10, wherein a plurality of the wafers are polished in a batch-wise manner.

12. The wafer polishing method according to claim 11, wherein a wavelength-variable-infrared laser is configured to measure the thickness of the plurality of the wafers by optical reflection interferometry.

13. The wafer polishing method according to claim 9, wherein a plurality of the wafers are polished in a batch-wise manner.

14. The wafer polishing method according to claim 9, wherein a wavelength-variable-infrared laser is configured to measure the thickness of the wafer by optical reflection interferometry.

15. The wafer polishing method according to claim 9, wherein:
- the double-side polishing apparatus includes a carrier having a wafer-holding hole,
- the upper turn table has a flat polishing-lower-surface and is configured to face towards the lower turn table having a flat polishing-upper-surface,
- the polishing pads are configured to be attached to the respective upper and lower turn tables,
- the upper turn table, the lower turn table, and the carrier are configured to hold the wafer, and
- the upper and lower turn tables are configured to press and rub the wafer while being rotationally driven.

16. The wafer polishing method according to claim 9, wherein the lifetime of the polishing pads is determined based on a polishing rate calculated from thickness data obtained by the measurement of the thickness of the wafer during polishing.

* * * * *